United States Patent
Segawa (10) Patent No.: US 11,016,391 B2
(45) Date of Patent: May 25, 2021

(54) LIGHT-EXPOSURE METHOD, LIGHT-EXPOSURE CONTROL UNIT, AND SEMICONDUCTOR DEVICE MANUFACTURING METHOD

(71) Applicant: TOSHIBA MEMORY CORPORATION, Minato-ku (JP)

(72) Inventor: Kazuhiro Segawa, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 244 days.

(21) Appl. No.: 16/288,326

(22) Filed: Feb. 28, 2019

(65) Prior Publication Data

US 2020/0073256 A1 Mar. 5, 2020

(30) Foreign Application Priority Data

Aug. 29, 2018 (JP) .............................. JP2018-160433

(51) Int. Cl.
*G03F 7/20* (2006.01)

(52) U.S. Cl.
CPC ........ *G03F 7/2022* (2013.01); *G03F 7/70616* (2013.01); *G03F 7/70633* (2013.01)

(58) Field of Classification Search
CPC . G03F 7/2022; G03F 7/70616; G03F 7/70633
USPC ........................................................ 430/30
See application file for complete search history.

(56) References Cited

U.S. PATENT DOCUMENTS

| 8,111,376 B2 | 2/2012 | Adel et al. |
| 2017/0148656 A1 | 5/2017 | Takakuwa |
| 2017/0271214 A1 | 9/2017 | Kasa et al. |

FOREIGN PATENT DOCUMENTS

| JP | 6140662 | 5/2017 |
| JP | 2017-097056 | 6/2017 |
| JP | 2017-167000 | 9/2017 |

*Primary Examiner* — Christopher G Young
(74) *Attorney, Agent, or Firm* — Oblon, McClelland, Maier & Neustadt, L.L.P.

(57) ABSTRACT

According to one embodiment, a first test process concerning a light-exposure process is performed by forming a first lower layer and a first upper layer on a first substrate. A second test process concerning a light-exposure process is performed by forming a second lower layer and a second upper layer on a second substrate. A correction model is created on a basis of results obtained in the first test process and the second test process. A manufacturing process is performed by forming a third lower layer and a third upper layer on a third substrate. In the manufacturing process, an overlay estimation correction value is calculated by using the correction model, based on a first pattern position deviation amount, a step processing history in the manufacturing process, a second pattern position deviation amount, and an overlay residual, and the overlay estimation correction value is used in a light-exposure process.

13 Claims, 10 Drawing Sheets

FIG.7A BEFORE MASK LAYOUT CORRECTION

FIG.7B MASK LAYOUT CORRECTION

FIG.7C AFTER MASK LAYOUT CORRECTION

LIGHT-EXPOSURE METHOD, LIGHT-EXPOSURE CONTROL UNIT, AND SEMICONDUCTOR DEVICE MANUFACTURING METHOD

CROSS-REFERENCE TO RELATED APPLICATIONS

This application is based upon and claims the benefit of priority from Japanese Patent Application No. 2018-160433, filed on Aug. 29, 2018; the entire contents of which are incorporated herein by reference.

FIELD

An embodiment described herein relates generally to a light-exposure method, a light-exposure control unit, and a semiconductor device manufacturing method.

BACKGROUND

Semiconductor memories have been shrunk and multilayered in recent years, and a difference in film stress is generated between cell array parts and peripheral circuit parts in the memories, by which the variations of overlay deviation amount within a light-exposure shot have become larger. In consideration of this, a mask layout correction method has been proposed, which arranges in advance a mask pattern layout for cell array parts in a deviating state in accordance with the overlay deviation amount.

However, according to conventional techniques, when the manufacturing process is changed or the manufacturing process has variations, it is difficult to ensure the overlay accuracy.

DETAILED DESCRIPTION

In general, according to one embodiment, a first test process concerning a light-exposure process is performed by forming a first lower layer and a first upper layer on a first substrate. The first test process includes performing film formation of the first lower layer on the first substrate, forming a first resist pattern by performing light-exposure to a resist present on the first lower layer by using a first photomask subjected to mask layout correction, processing the first lower layer by using the first resist pattern as a mask, performing film formation of the first upper layer on the first lower layer, forming a second resist pattern by performing light-exposure to a resist present on the first upper layer by using a second photomask subjected to mask layout correction, and processing the first upper layer by using the second resist pattern as a mask. Further, a second test process concerning a light-exposure process is performed by forming a second lower layer and a second upper layer on a second substrate. The second test process includes performing film formation of the second lower layer on the second substrate, forming a third resist pattern by performing light-exposure to a resist present on the second lower layer by using the first photomask, processing the second lower layer by using the third resist pattern as a mask, performing film formation of the second upper layer on the second lower layer, forming a fourth resist pattern by performing light-exposure to a resist present on the second upper layer by using the second photomask, and processing the second upper layer by using the fourth resist pattern as a mask. A first pattern position deviation amount attributed to a layout between upper and lower layer patterns in each of the first test process and the second test process is calculated. A step processing history in each of the first test process and the second test process is acquired. A second pattern position deviation amount attributed to a substrate shape between the upper and lower layer patterns in each of the first test process and the second test process is calculated. An overlay residual between the upper and lower layer patterns after light-exposure in each of the first test process and the second test process is calculated. A correction model calculating an overlay estimation correction value between the upper and lower layers is created, on a basis of the first pattern position deviation amount, the step processing history, the second pattern position deviation amount, and the overlay residual. A manufacturing process is performed by forming a third lower layer and a third upper layer on a third substrate. The manufacturing process includes performing film formation of the third lower layer on the third substrate, forming a fifth resist pattern by performing light-exposure to a resist present on the third lower layer by using the first photomask, processing the third lower layer by using the fifth resist pattern as a mask, performing film formation of the third upper layer on the third lower layer, and forming a sixth resist pattern by performing light-exposure to a resist present on the third upper layer by using the second photomask. In the performing the manufacturing process, an overlay estimation correction value is calculated by using the correction model, on a basis of the first pattern position deviation amount, a step processing history in the manufacturing process, the second pattern position deviation amount, and the overlay residual, and the overlay estimation correction value is used in a light-exposure process.

An exemplary embodiment of a light-exposure method, a light-exposure control unit, and a semiconductor device manufacturing method will be explained below in detail with reference to the accompanying drawings. The present invention is not limited to the following embodiment.

Figure 1A:
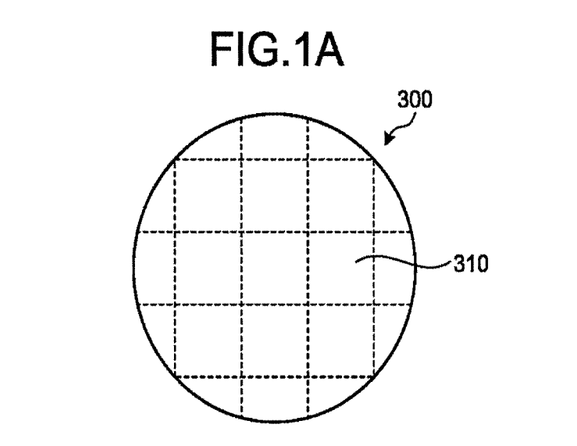
FIGS. 1A to 1E are diagrams illustrating an outline of overlay deviation due to adoption of a multilayered structure of a semiconductor memory.
Figure 1B:
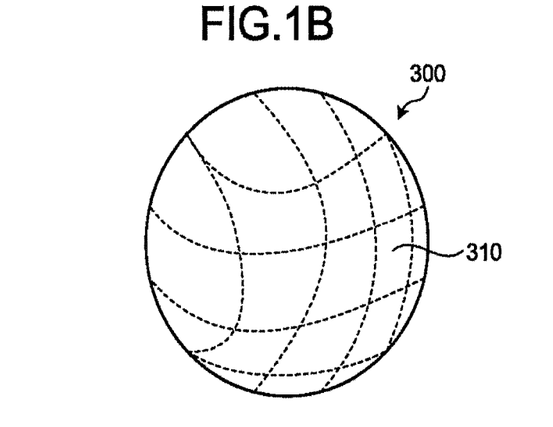

FIGS. 1A to 1E are diagrams illustrating an outline of overlay deviation due to adoption of a multilayered structure of a semiconductor memory. In recent years, semiconductor memories are formed in a downsizing and multilayered structure. When a multilayered structure is formed on a flat wafer 300 as illustrated in FIG. 1A, the wafer 300 is distorted as illustrated in FIG. 1B, because of an influence of a film stress due to the multilayered structure. Here, in FIGS. 1A and 1B, each region demarcated by broken lines corresponds to a shot region 310.

In order to ensure the overlay accuracy, there is a control method used in general, which calculates a correction value of light-exposure position, on the basis of an alignment measurement result obtained in light-exposure and overlay examination results obtained after the light-exposure and after processing, and then uses the correction value to perform feedback correction to a light-exposure apparatus and then to perform light-exposure. Further, in addition to the above control method, there is a control method used recently, which estimates an overlay deviation amount (IPD: In-Plane Distortion) attributed to a film stress, by measuring the shape of a wafer 300 before light-exposure, then calculates a correction value of light-exposure position from the estimation result, and then uses the correction value to perform feedforward correction to a light-exposure apparatus and then to perform light-exposure. The control described above is performed by Advanced Process Control (APC).

However, a problem has come to arise in that, even if the control methods described above is used, it is difficult to ensure the overlay accuracy. In this problem, because of a film stress difference between the cell array parts and the peripheral circuit parts, a variation of overlay deviation amount within a light-exposure shot becomes too large for a light-exposure apparatus to be driven to follow corrections of light-exposure position, and thus the overlay correction residual ends up being larger.

Figure 1C:
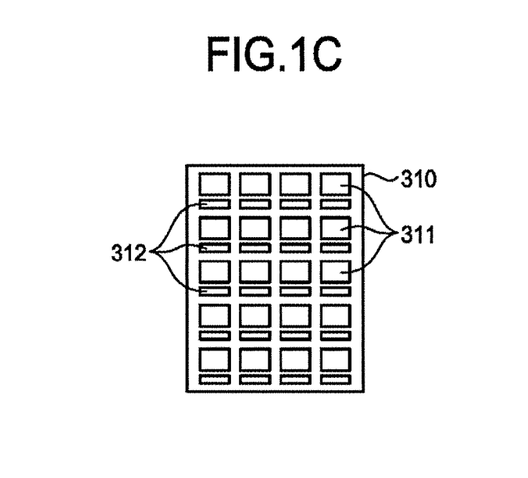

For example, as illustrated in FIG. 1C, within one shot region 310 in the wafer 300, a plurality of memory cell array parts 311 and peripheral circuit parts 312 are arranged. The films that form the memory cell array parts 311 are different from the films that form the peripheral circuit parts 312, and the film stress difference between these films causes distortion on the entire shot region 310 that is to be a chip.

Figure 1D:
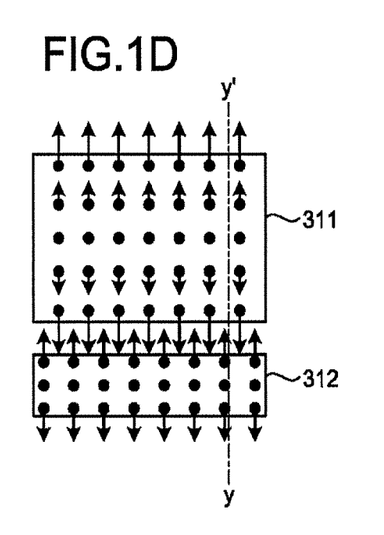
Figure 1E:
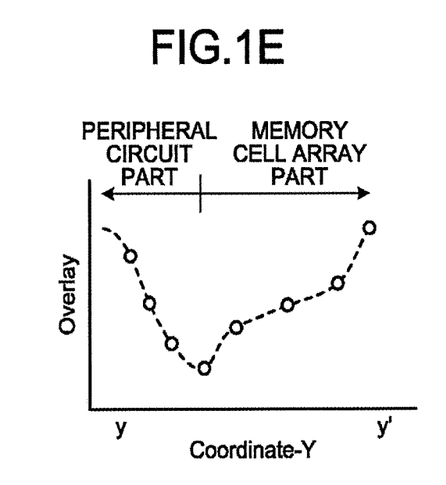

FIG. 1D illustrates an example of degrees of the overlay deviation amount at respective positions in a memory cell array part 311 and a peripheral circuit part 312. In FIG. 1D, the orientation of an arrow represents the overlay deviation direction, and the size of an arrow represents the overlay deviation amount. As illustrated in FIG. 1D, in the memory cell array part 311, the overlay deviation amount degree varies depending on the place, and, also in the peripheral circuit part 312, the overlay deviation amount degree varies depending on the place. For example, in the case of the overlay deviation amount along a line y-y' of FIG. 1D, as illustrated in FIG. 1E, the overlay deviation amount degree varies to a large extent depending on the place in the memory cell array part 311 and the peripheral circuit part 312. FIG. 1E relates to some of the memory cell array parts 311 and the peripheral circuit parts 312 within the shot region 310, but substantially the same tendency is found over the entirety of the shot region 310.

With respect to a large variation of the overlay deviation amount in the shot region 310, it can be considered to apply a method for mask layout correction that arranges in advance a mask pattern layout for the memory cell array parts 311, which are larger in region area than the peripheral circuit parts 312, in a deviating state in accordance with the overlay deviation amount. However, in a case where the mask layout correction is applied, when the manufacturing process is changed or the manufacturing process has variations, it becomes more difficult to ensure the overlay accuracy. In consideration of this, in the following embodiment, an explanation will be given of a light-exposure method, a light-exposure control unit, and a semiconductor device manufacturing method, which are new and additionally coupled with a mask layout correction method.

Figure 2:
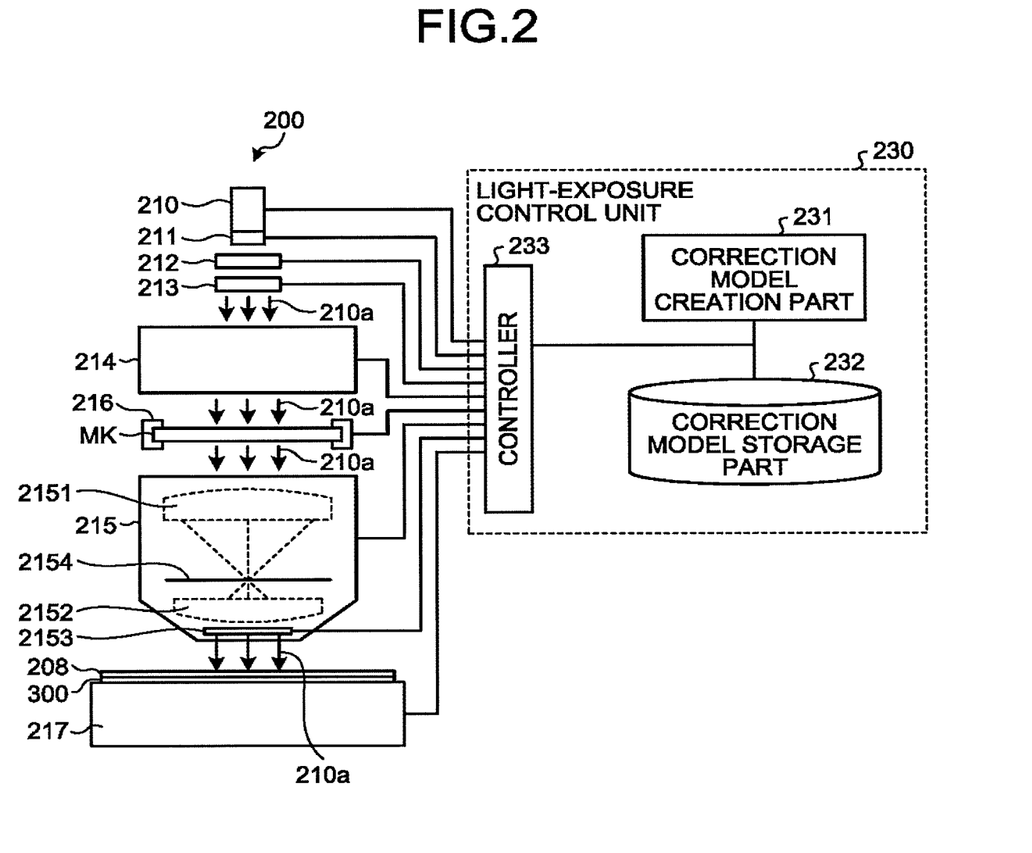
FIG. 2 is a diagram schematically illustrating a configuration example of a light-exposure apparatus including a light-exposure control unit according to an embodiment.

FIG. 2 is a diagram schematically illustrating a configuration example of a light-exposure apparatus including a light-exposure control unit according to an embodiment. The light-exposure control unit 230 is configured to control the light-exposure apparatus 200, and to create a correction model for calculating an overlay estimation correction value in light-exposure described later. The light-exposure control unit 230 may be formed of an information processing unit, such as a personal computer, connected to the light-exposure apparatus 200 through a communication line. Alternatively, the light-exposure control unit 230 may be formed of an information processing unit, such as a server, connected to the light-exposure apparatus 200 through a network.

The light-exposure control unit 230 includes a correction model creation part 231, a correction model storage part 232, and a controller 233. The correction model creation part 231 is configured to create a correction model for calculating an overlay estimation correction value for use in performing light-exposure for semiconductor devices to be products, in accordance with a correction model creation process described later. The correction model storage part 232 is configured to store the correction model created by the correction model creation part 231. The correction model is stored in a state correlated with a mask layout correction amount and the step processing history of a wafer, for example. The controller 233 is configured to control respective parts of the light-exposure apparatus 200. Further, when light-exposure is to be performed, the controller 233 obtains a correction model corresponding to the mask layout correction amount for a photomask to be used and the step processing history of a wafer, from the correction model storage part 232, and corrects the light-exposure apparatus 200 by using an overlay estimation correction value calculated from this correction model.

In order to create a correction model in the correction model creation part 231, the following steps are performed. A photomask is formed by performing mask layout correction to the reference photomask. Then, by using the photomask thus formed, a processing process is preformed under reference processing conditions, and an overlay residual at this time is acquired. Further, by using the photomask thus formed, the processing process is preformed under changed processing conditions set by changing some of the reference processing conditions, and an overlay residual at this time is acquired. The correction model creation part 231 uses the overlay residuals thus acquired, and creates a correction model to provide an overlay estimation correction value to cause the overlay residual, in the case where the processing process is performed under the changed processing conditions, to be smaller than a determination threshold. The processing process may be exemplified by a film formation process, heating process, or etching process. The heating process also includes a thermal history applied in a film formation process. The creation of a correction model will be described later. The determination threshold is the maximum value of overlay residual acceptable in semiconductor device manufacturing. The correction model creation part 231 is corresponding to an arithmetic processing part.

The light-exposure apparatus 200 includes a light source 210, an aperture diaphragm 211, a filter 212, a polarization filter 213, an illumination optical system 214, a projection optical system 215, a mask stage 216, and a substrate stage 217. The mask stage 216 is configured to hold a photomask MK. The substrate stage 217 is configured to hold a wafer 300 (substrate), which is coated with a resist 208, here.

The light source 210 is configured to emit light-exposure light 210a, such as ArF excimer laser, KrF excimer laser, Deep Ultra-Violet (DUV) light having a wavelength of 248 nm or 193 nm, or Extreme Ultra-Violet (EUV) light having a wavelength of 13.5 nm, for example.

The aperture diaphragm 211 has an almost circular plate shape, for example, and includes a light-emitting region (illumination region) and a non-light-emitting region (illumination shielding region). The non-light-emitting region is a region for shielding the light-exposure light 210a emitted from the light source 210, and the light-emitting region is a region for transmitting the light-exposure light 210a emitted from the light source 210. The aperture diaphragm 211 is configured to change the shape of the light-emitting region to change the illumination shape.

The filter 212 is arranged to change the luminance distribution of the light-exposure light 210a sent from the light source 210 through the aperture diaphragm 211. The polarization filter 213 is arranged to align the amplitude direction of the light-exposure light 210a sent from the light source 210 through the aperture diaphragm 211 and the filter 212.

The illumination optical system 214 is formed of a fly-eye lens, multistage condenser lens, or the like (not illustrated), for example, and is configured to adjust the coverage or the like of the light-exposure light 210a to be incident onto the photomask MK.

The projection optical system 215 includes a function to perform reduction projection of the mask pattern formed on the photomask MK to the resist 208. The projection optical system 215 includes a plurality of lenses (for example, lenses 2151 and 2152), and a lens aperture diaphragm 2153. The projection optical system 215 is configured to adjust the position of a pupil surface 2154 by the lenses 2151 and 2152.

The lens aperture diaphragm 2153 is arranged to change the shape of the light-exposure light 210a emitted from the lens 2152. The lens aperture diaphragm 2153 changes the pupil size of the projection optical system 215 to shield that part of the light-exposure light 210a which is distant from the central axis of the projection optical system 215.

Figure 3:
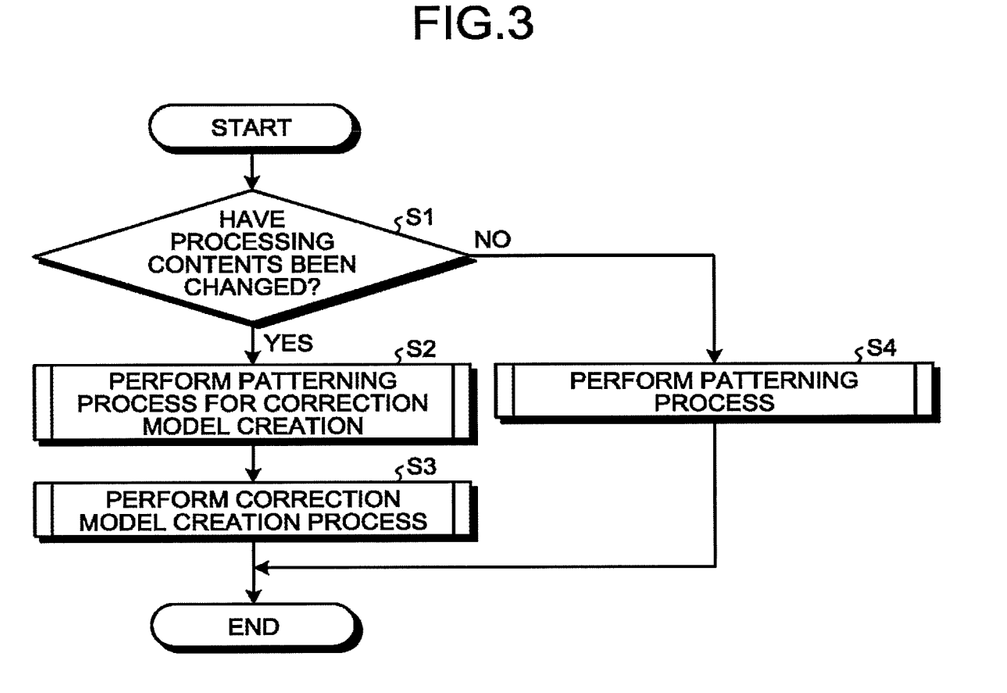
FIG. 3 is a flowchart illustrating an example of the sequence of a semiconductor device manufacturing method according the embodiment.

Next, an explanation will be given of a semiconductor device manufacturing method. FIG. 3 is a flowchart illustrating an example of the sequence of a semiconductor device manufacturing method according the embodiment. First, the controller 233 determines whether the processing contents have been changed for a wafer to be processed (step S1). Here, the controller 233 determines whether processing contents to be executed are not included in the processing contents correlated with correction models stored in the correction model storage part 232. The processing contents may be exemplified by a photomask to be used, conditions for a processing process, and so forth.

When the processing contents have been changed (Yes at step S1), a patterning process for correction model creation is performed (step S2). On the basis of a result obtained by the patterning process for correction model creation, the light-exposure control unit 230 performs a correction model creation process (step S3). Then, the processing sequence ends.

On the other hand, when the processing contents have not been changed (No at step S1), an ordinary patterning process is performed (step S4). For example, with respect to a wafer for manufacturing products, an overlay estimation correction value obtained from a correction model created by a correction model creation process is used to perform correction in a light-exposure process, and the patterning process is thereby performed. Then, the processing sequence ends.

Figure 4:
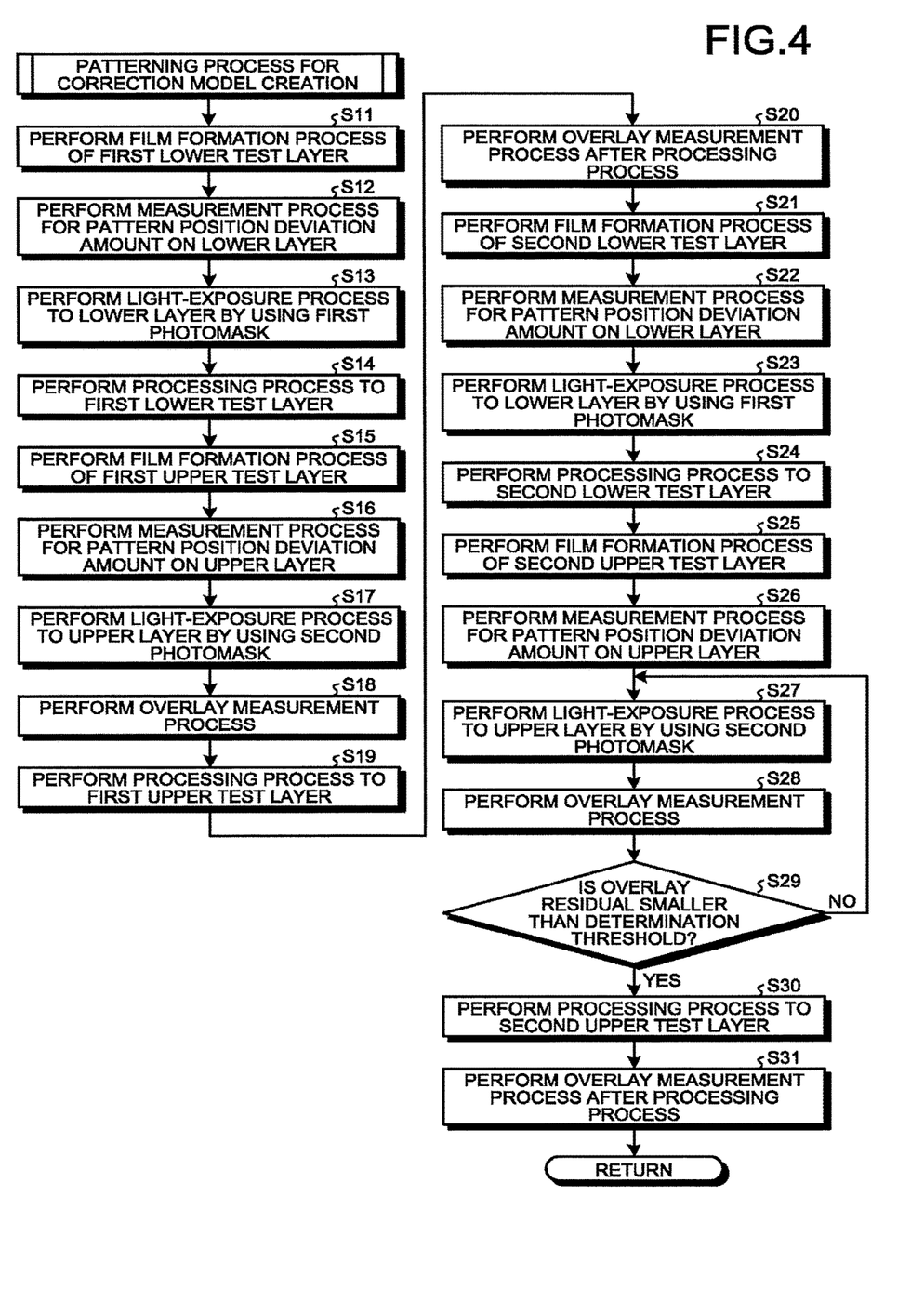
FIG. 4 is a flowchart illustrating an example of the sequence of a patterning process for correction model creation.

Next, an explanation will be given of the respective processes in step S2 to S4 in detail. FIG. 4 is a flowchart illustrating an example of the sequence of the patterning process for correction model creation. FIGS. 5A to 5D are sectional views schematically illustrating procedures of the patterning process in a multilayered structure. The patterning process for correction model creation includes a first process and a second process. In the first process, the process is performed by using a photomask subjected to mask layout correction, and an overlay deviation amount at this time is acquired. In the second process, the process is performed by using the photomask under processing conditions different from those of the first process, and an overlay deviation amount at this time is acquired.

Figure 5A:
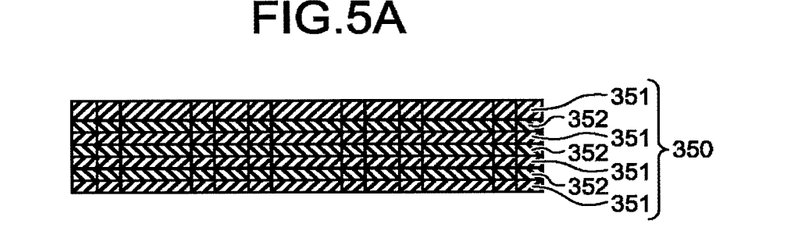
FIGS. 5A to 5D are sectional views schematically illustrating procedures of the patterning process in a multilayered structure.

First, a film formation process is performed on a wafer to form a first lower test layer 350 on the lower side (step S11). For example, as illustrated in FIG. 5A, the first lower test layer 350 is formed on the wafer (not illustrated), by stacking a plurality of first films 351 and a plurality of second films 352, alternately one by one. For example, each of the first films 351 is a silicon oxide film, and each of the second films 352 is a silicon nitride film. The film formation process may be exemplified by a Chemical Vapor Deposition (CVD) method or the like. The wafer corresponds to a first substrate, and the first lower test layer 350 corresponds to a first lower layer.

Then, the shape of the wafer after formation of the first lower test layer 350 is measured. Specifically, a measurement process is performed for a pattern position deviation amount attributed to a film stress on the lower layer (step S12). Thereafter, a resist (not illustrated) is applied onto the first lower test layer 350, and a light-exposure process is performed to the resultant lower layer by using a first photomask (not illustrated) (step S13). By the light-exposure process, overlay marks for use in overlay measurement are formed on dicing lines.

Figure 5B:
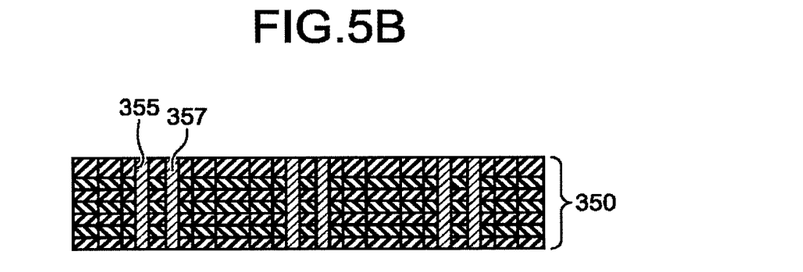

Thereafter, a resist pattern is formed by developing the resist, and then a processing process is performed to the first lower test layer 350 by using the resist pattern as a mask (step S14). As the processing process, for example, as illustrated in FIG. 5B, an etching process, such as a Reactive Ion Etching (RIE) method, is performed to form memory holes 355 in the first lower test layer 350, and then an embedding process is performed to fill each of the memory holes 355 with a conductive film 357. Further, by the etching process, overlay marks are formed on the first lower test layer 350 on dicing lines.

Figure 5C:
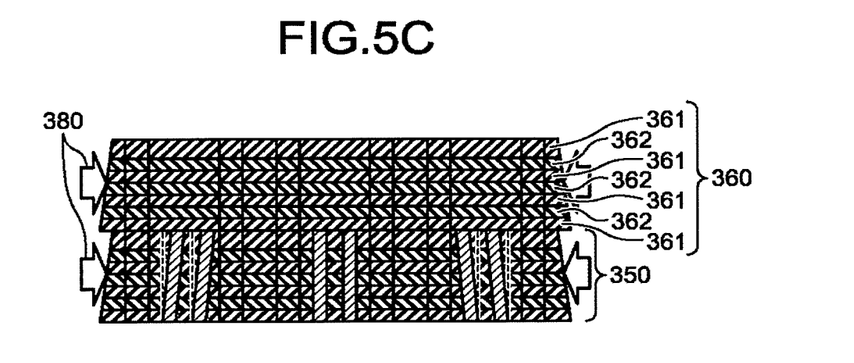

Then, a film formation process is performed on the first lower test layer 350 on the lower side to form a first upper test layer 360 on the upper side (step S15). For example, as illustrated in FIG. 5C, the first upper test layer 360 is formed by stacking a plurality of first films 361 and a plurality of second films 362, alternately one by one, on the first lower test layer 350. For example, each of the first films 361 is a silicon oxide film, and each of the second films 362 is a silicon nitride film. The film formation process may be exemplified by a CVD method or the like. At this time, a stress 380 is applied to the first lower test layer 350 and the first upper test layer 360, and thus the first lower test layer 350 and the first upper test layer 360 are distorted. The first upper test layer 360 corresponds to a first upper layer.

Then, the shape of the wafer after formation of the first upper test layer 360 is measured. Specifically, a measurement process is performed for a pattern position deviation amount attributed to a film stress on the upper layer (step S16). Thereafter, a resist (not illustrated) is applied onto the first upper test layer 360, and a light-exposure process is performed to the resultant upper layer by using a second photomask (not illustrated) (step S17). By the light-exposure process, overlay marks for use in overlay measurement are formed on dicing lines. The overlay marks on the resist pattern on the first upper test layer 360 are formed at positions overlapping with the overlay marks on the first lower test layer 350. Thereafter, a resist pattern is formed by developing the resist.

Figure 5D:
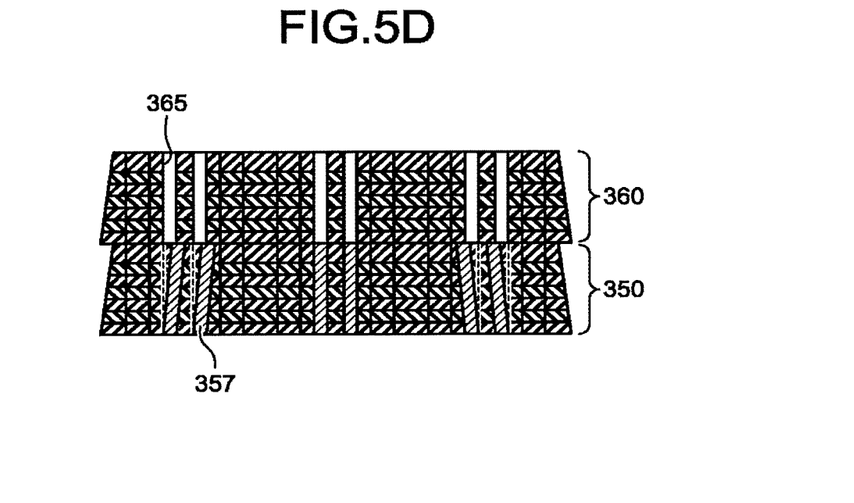

Then, an overlay measurement process is performed by using the overlay marks formed on the first lower test layer 350 and the overlay marks formed on the resist pattern on the first upper test layer 360 (step S18). Thereafter, a processing process is performed to the first upper test layer 360 by using the resist pattern as a mask (step S19). As the processing process, for example, as illustrated in FIG. 5D, an etching process, such as an RIE method, is performed to form memory holes 365 in the first upper test layer 360. At this time, overlay marks are formed on the first upper test layer 360 on dicing lines.

Thereafter, an overlay measurement process after the processing process is performed by using the overlay marks formed on the first lower test layer 350 and the overlay marks formed on the first upper test layer 360 (step S20).

Then, a film formation process is performed on another wafer to form a second lower test layer on the lower side (step S21). This film formation process is substantially the same as the process illustrated in FIG. 5A, such that the second lower test layer is formed by a CVD method or the like, by stacking a plurality of first films and a plurality of second films, alternately one by one. As compared with the first lower test layer 350, the film formation conditions for the second lower test layer may be changed. The other wafer mentioned above corresponds to a second substrate, and the second lower test layer corresponds to a second lower layer.

Thereafter, the shape of the wafer after formation of the second lower test layer is measured. Specifically, a measurement process is performed for a pattern position deviation amount attributed to a film stress on the lower layer (step S22). Then, a resist is applied onto the second lower test layer, and a light-exposure process is performed to the resultant lower layer by using the first photomask (step S23). By the light-exposure process, overlay marks for use in overlay measurement are formed on dicing lines.

Thereafter, a resist pattern is formed by developing the resist, and then a processing process is performed to the second lower test layer by using the resist pattern as a mask (step S24). As the processing process, for example, as in the process illustrated in FIG. 5B, an etching process, such as an RIE method, is performed to form memory holes in the second lower test layer, and then an embedding process is performed to fill each of the memory holes with a conductive film. Further, by the etching process, overlay marks are formed on the second lower test layer on dicing lines.

Then, a film formation process is performed on the second lower test layer to form a second upper test layer on the upper side (step S25). For example, as in the process illustrated in FIG. 5C, the second upper test layer is formed by a CVD method or the like, by stacking a plurality of first films and a plurality of second films, alternately one by one, on the second lower test layer. As compared with the first upper test layer 360, the film formation conditions for the second upper test layer may be changed. At this time, a stress is applied to the second lower test layer and the second upper test layer, and thus the second lower test layer and the second upper test layer are distorted. The second upper test layer corresponds to a second upper layer.

Thereafter, the shape of the wafer after formation of the second upper test layer is measured. Specifically, a measurement process is performed for a pattern position deviation amount attributed to a film stress on the upper layer (step S26). Then, a resist is applied onto the second upper test layer, and a light-exposure process is performed to the resultant upper layer by using the second photomask (step S27). By the light-exposure process, overlay marks for use in overlay measurement are formed on dicing lines. The overlay marks on the resist pattern on the second upper test layer are formed at positions overlapping with the overlay marks on the second lower test layer. Thereafter, a resist pattern is formed by developing the resist.

Then, an overlay measurement process is performed by using the overlay marks formed on the second lower test layer and the overlay marks formed on the resist pattern on the second upper test layer (step S28). Then, it is determined whether an overlay residual obtained as a result of the overlay measurement process is smaller than a determination threshold (step S29). For example, the determination threshold is the maximum value of deviation amount acceptable for the overlay residual. When the overlay residual is not smaller than the determination threshold (No at step S29), the processing sequence returns to step S27. Here, the processes described above are repeated, by removing the resist pattern, applying a new resist, and changing the light-exposure conditions, until the overlay residual becomes smaller than the determination threshold.

On the other hand, when the overlay residual is smaller than the determination threshold (Yes at step S29), a processing process is performed to the second upper test layer (step S30). As the processing process, for example, as in the process illustrated in FIG. 5D, an etching process is performed. At this time, overlay marks are formed on the second upper test layer on dicing lines.

Then, an overlay measurement process after the processing process is performed by using the overlay marks formed on the second lower test layer and the overlay marks formed on the second upper test layer (step S31). Then, the processing sequence returns to the flowchart of FIG. 3.

Figure 6:
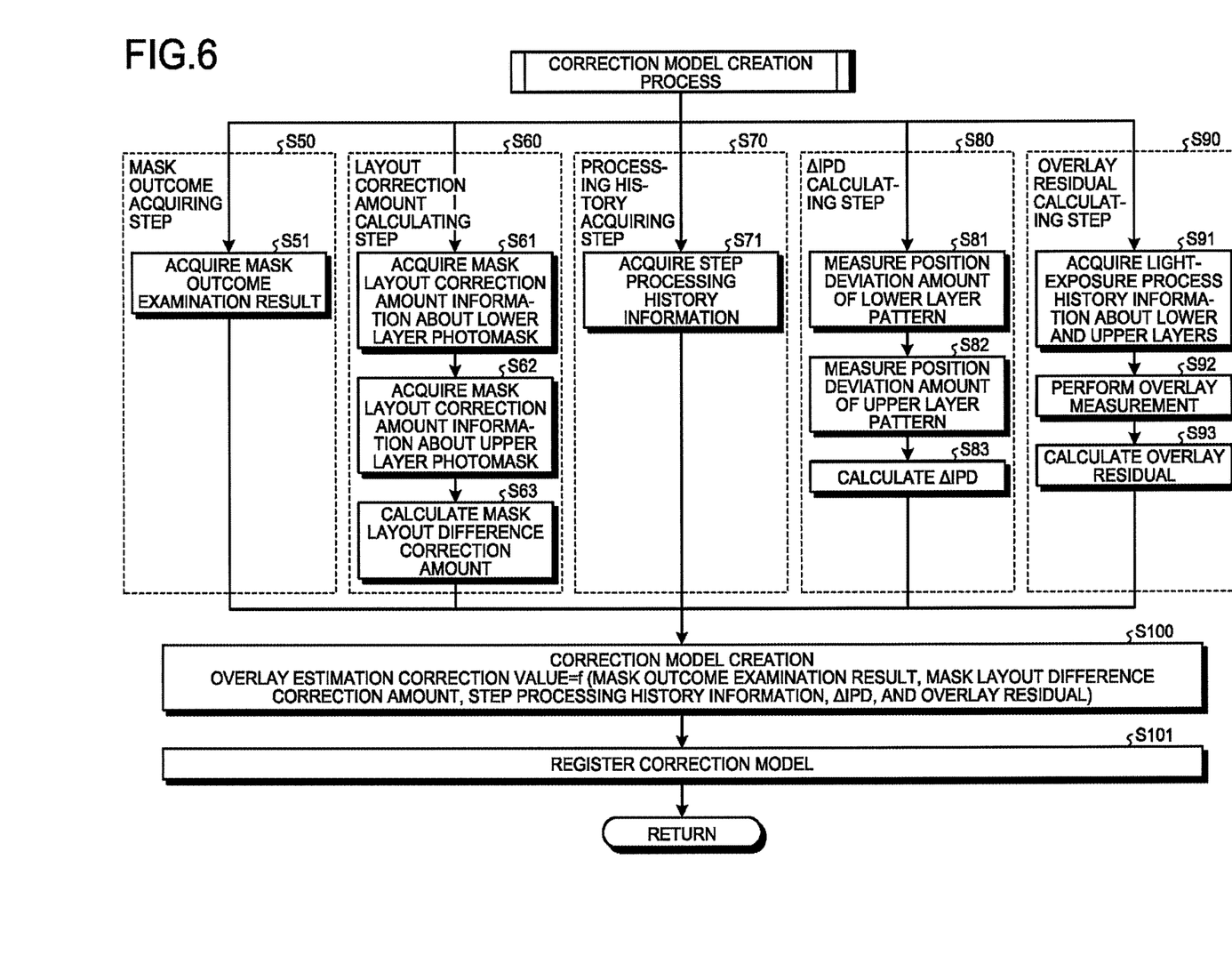
FIG. 6 is a flowchart illustrating an example of the sequence of a correction model creation process.

FIG. 6 is a flowchart illustrating an example of the sequence of a correction model creation process. The correction model creation process is a process to be executed by the correction model creation part 231 of the light-exposure control unit 230. The correction model creation process performs a mask outcome acquiring step (step S50), a layout correction amount calculating step (step S60), a processing history acquiring step (step S70), a $\Delta$IPD calculating step (step S80), and an overlay residual calculating step (step S90).

In the mask outcome acquiring step of step S50, a mask outcome examination result is acquired about each of the first photomask and the second photomask for use in a light-exposure process (step S51). When an actually formed photomask is compared with its design data, a pattern position deviation or the like has been generated. This position deviation is acquired as a mask outcome examination result. The pattern position deviation amount attributed to a wafer stress includes a mask position deviation (lithography deviation). In order to subtract the mask position deviation from the pattern position deviation amount, the mask outcome examination result is acquired.

In the layout correction amount calculating step of step S60, mask layout correction amount information is acquired about the first photomask for use in lower layer patterning (step S61). Similarly, mask layout correction amount information is acquired about the second photomask for use in upper layer patterning (step S62).

Figure 7A:
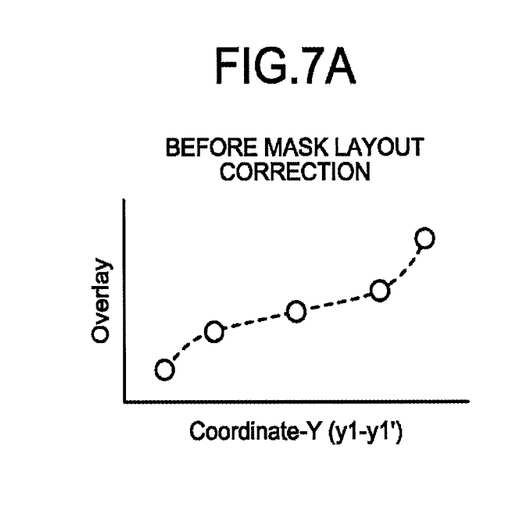
FIGS. 7A to 7C are diagrams for explaining an outline of mask layout correction.
Figure 7B:
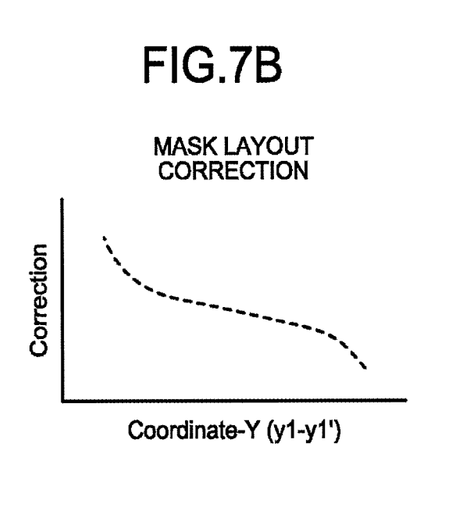
Figure 7C:
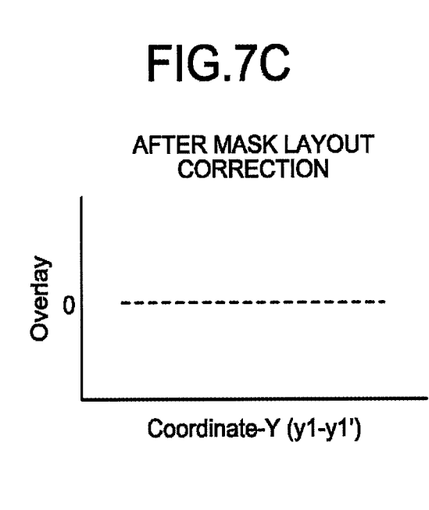

FIGS. 7A to 7C are diagrams for explaining an outline of mask layout correction. FIG. 7A illustrates overlay residuals along the line y1-y1' on a memory cell array part 311. In order to set these overlay residuals to be zero, the mask layout of a photomask can be shifted to cancel out the residuals at the respective positions in FIG. 7A. For example, as illustrated in FIG. 7B, correction values are calculated for the respective positions in the photomask, which correspond to the memory cell array part 311. When the mask layout correction illustrated in FIG. 7B is performed to the photomask including the overlay residuals illustrated in FIG. 7A, the overlay residuals become zero in the ideal state as illustrated in FIG. 7C.

Then, the pattern position deviation amount attributed to a layout between upper and lower layer patterns is calculated. Specifically, on the basis of the mask layout correction amount information about the first photomask for use in the lower layer and the mask layout correction amount information about the second photomask for use in the upper layer, a mask layout difference correction amount is calculated (step S63). The mask layout difference correction amount corresponds to a first pattern position deviation amount attributed to a layout between the upper and lower layer patterns.

In the processing history acquiring step of step S70, step processing history information is acquired (step S71). The step processing history information may be exemplified by the film formation conditions and the thermal history of the film formation process, the etching conditions in the processing process, or the like. For example, the film formation conditions in each of steps S11, S15, S21, and S25 of FIG. 4 are acquired. At this time, if the wafer is heated, its thermal history is also acquired. Further, the etching conditions and the conductive film formation conditions in each of steps S14, S19, S24, and S30 of FIG. 4 are acquired. Further, the step processing history may include information, stages, chambers, and results concerning a measuring apparatus, a film formation apparatus, and a processing process apparatus.

In the ΔIPD calculating step of step S80, a wafer shape measurement result is acquired about a state before light-exposure for the lower layer pattern (step S81). For example, the wafer shape measurement result about the lower layer pattern is a measurement result about the position deviation amount of the lower layer pattern in each of steps S12 and S22 of FIG. 4. Then, a wafer shape measurement result is acquired about a state before light-exposure for the upper layer pattern (step S82). For example, the wafer shape measurement result about the upper layer pattern is a measurement result about the position deviation amount of the upper layer pattern in each of steps S16 and S26 of FIG. 4. Then, on the basis of the wafer shape measurement results about the lower layer pattern and the upper layer pattern, a pattern position deviation amount attributed to the wafer shape between the upper and lower layer patterns, i.e., a ΔIPD is calculated (step S83). The ΔIPD corresponds to a second pattern position deviation amount attributed to the substrate shape between the upper and lower layer patterns.

In the overlay residual calculating step of step S90, light-exposure process history information about the lower and upper layer patterns is acquired (step S91). The light-exposure process history information includes the light-exposure process conditions or the like for each of the lower layer pattern and the upper layer pattern. The light-exposure process history information corresponds to the step processing history. Thereafter, an overlay measurement process result is acquired about the upper layer pattern after a light-exposure process (step S92). For example, an overlay measurement process result in each of steps S18, S20, S28, and S31 of FIG. 4 is acquired. The overlay measurement process result may be formed of a result acquired after the light-exposure process of each of steps S18 and S28 of FIG. 4, or a result acquired after the processing process of each of steps S20 and S31 of FIG. 4. Then, on the basis of the overlay measurement process result, an overlay residual is calculated (step S93). The overlay residual corresponds to an overlay residual between the upper and lower layer patterns.

The processes described above are performed in the processing sequence of the patterning process for correction model creation in steps S11 to S31 of FIG. 4. Then, after these processes, the correction model creation part 231 creates a correction model for an overlay estimation correction value, on the basis of the mask outcome examination result, the mask layout difference correction amount, the step processing history information, the ΔIPD, and the overlay residual (step S100). At this time, the correction model may be created by utilizing machine learning. Here, the correction model may be formed of a machine learning model categorized as having teacher data, or may be formed of a machine learning model categorized as having no teacher data.

Thereafter, the correction model creation part 231 stores the correction model into the correction model storage part 232 (step S101). The correction model is correlated with the mask outcome examination result, the mask layout difference correction amount, and the step processing history information, for example. As a result, the correction model creation process ends.

Figure 8:
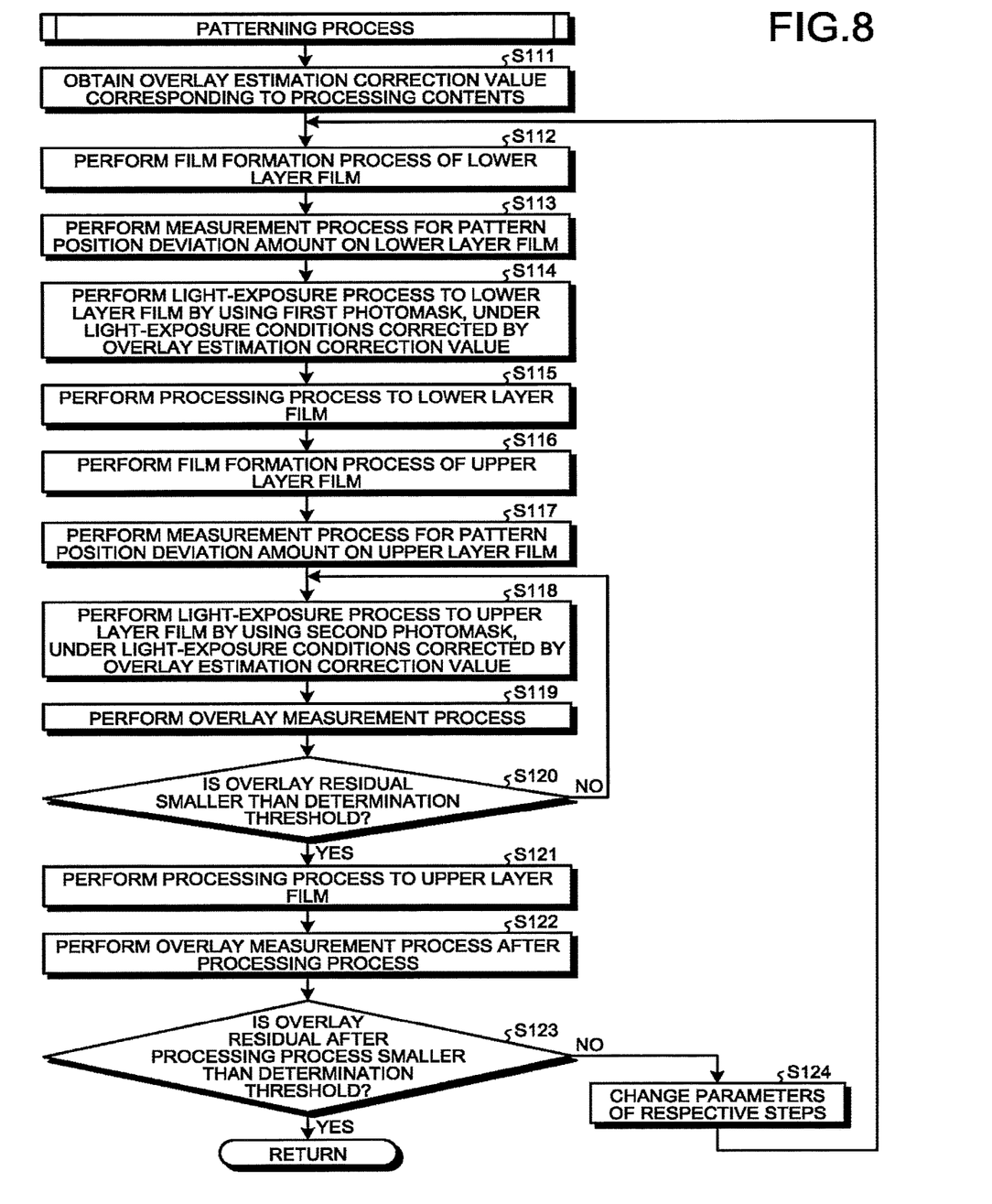
FIG. 8 is a flowchart illustrating an example of the sequence of a patterning process in which light-exposure process conditions are corrected by using a correction model.

FIG. 8 is a flowchart illustrating an example of the sequence of a patterning process in which light-exposure process conditions are corrected by using a correction model. The patterning process illustrated by this flowchart is a process directed to a wafer for manufacturing actual products, and is part of a semiconductor device manufacturing method.

First, the controller 233 obtains an overlay estimation correction value corresponding to the processing contents for a wafer to be processed, from the correction models stored in the correction model storage part 232 (step S111). At this time, the processing contents may be exemplified by a photomask to be used, film formation conditions, heating process conditions, etching conditions, and so forth. The controller 233 obtains a correction model created by substantially the same processing contents, and acquires an overlay estimation correction value from this correction model. Here, it is assumed that the first photomask is used as a photomask for forming the lower layer pattern and the second photomask is used as a photomask for forming the upper layer pattern.

Then, a film formation process is performed under predetermined film formation conditions to form a lower layer film on the wafer (step S112). This film formation process is substantially the same as the process illustrated in FIG. 5A, such that the lower layer film is formed by a CVD method or the like, by stacking a plurality of first films and a plurality of second films, alternately one by one. The film formation conditions for the lower layer film may be the same as the film formation conditions for the second lower test layer, for example. Here, the wafer corresponds to a third substrate, and the lower layer film corresponds to a third lower layer.

Thereafter, the shape of the wafer after formation of the lower layer film is measured. Specifically, a measurement process is performed for a pattern position deviation amount attributed to a stress on the lower layer film (step S113). Further, a resist is applied onto the lower layer film, and a light-exposure process is performed to the resultant lower layer film by using the first photomask, under light-exposure conditions corrected by the overlay estimation correction value acquired in step S111 (step S114). Here, the light-exposure process is performed under light-exposure conditions the same as those for the light-exposure process of step S23 of FIG. 4, for example. By the light-exposure process, overlay marks for use in overlay measurement are formed on dicing lines.

Then, a resist pattern is formed by developing the resist, and then a processing process is performed to the lower layer film by using the resist pattern as a mask (step S115). As the processing process, for example, as in the process illustrated in FIG. 5B, an etching process, such as an RIE method, is performed to form memory holes in the lower layer film, and then an embedding process is performed to fill each of the memory holes with a conductive film. Further, by the etching process, overlay marks are formed on the lower layer film on dicing lines. The processing process conditions for the lower layer film may be the same as the processing process conditions for the second lower test layer, for example.

Thereafter, a film formation process is performed under predetermined film formation conditions to form an upper layer film on the lower layer film subjected to the processing process (step S116). This film formation process is substantially the same as the process illustrated in FIG. 5C, such that the upper layer film is formed by a CVD method or the like, by stacking a plurality of first films and a plurality of second films, alternately one by one, on the lower layer film. The film formation conditions for the upper layer film may be the same as the film formation conditions for the second upper test layer, for example. Here, the upper layer film corresponds to a third upper layer.

Then, the shape of the wafer after formation of the upper layer film is measured. Specifically, a measurement process is performed for a pattern position deviation amount attributed to a stress on the upper layer film (step S117). Further, a resist is applied onto the upper layer film, and a light-exposure process is performed to the resultant upper layer film by using the second photomask, under light-exposure conditions corrected by the overlay estimation correction value acquired in step S111 (step S118). Here, the light-exposure process is performed under light-exposure conditions the same as those for the changed light-exposure process of step S27 of FIG. 4, for example. By the light-exposure process, overlay marks for use in overlay measurement are formed on dicing lines. The overlay marks on the resist pattern on the upper layer film are formed at positions overlapping with the overlay marks on the lower layer film. Thereafter, a resist pattern is formed by developing the resist.

Then, an overlay measurement process is performed by using the overlay marks formed on the lower layer film and the overlay marks formed on the resist pattern on the upper layer film (step S119), and an overlay residual is thereby calculated. The controller 233 determines whether the resulting overlay residual is smaller than a determination threshold (step S120). The determination threshold is the maximum value acceptable for the overlay residual, in consideration of subsequent process steps.

When the overlay residual is equal to or larger than the determination threshold (No at step S120), the processing sequence returns step S118. In this case, the resist pattern is peeled off by a resist peeling technique, a new resist is applied, and the light-exposure process is performed to the resultant upper layer film under changed light-exposure conditions. These processes are repeatedly executed until the overlay residual becomes smaller than the determination threshold, for example.

On the other hand, when the overlay residual is smaller than the determination threshold (Yes at step S120), a processing process is performed to the upper layer film by using the resist pattern as a mask (step S121). As the processing process to the upper layer film, for example, as in the process illustrated in FIG. 5D, an etching process is performed. At this time, overlay marks are formed on the upper layer film on dicing lines.

Thereafter, an overlay measurement process after the processing process is performed by using the overlay marks formed on the lower layer film and the overlay marks formed on the upper layer film (step S122), and an overlay residual is thereby calculated. The controller 233 determines whether the resulting overlay residual after the processing process is smaller than a determination threshold (step S123). When the overlay residual is smaller than the determination threshold (Yes at step S123), it means that the position of the upper layer pattern is present within an acceptable range, as compared with the position of the lower layer pattern. Thus, the processing sequence ends, and returns to FIG. 3.

On the other hand, when the overlay residual is equal to or larger than the determination threshold (No at step S123), parameters in respective process steps are changed (step S124), and the processing sequence returns to step S112. In the subsequent processes from step S112, the processes are performed to another wafer by using the changed parameters.

In the above description, an explanation has been given of a case where the overlay deviation amount can be held to fall within an acceptable range even if the manufacturing process is changed by using a photomask subjected to mask layout correction. However, this embodiment can be applied to a case where the manufacturing process has variations. There is a case where a variation in the manufacturing process occurs due to a difference in a film formation apparatus or etching apparatus used for processing a wafer, for example. In consideration of this, the correction model creation process described above is executed for each film formation apparatus and/or each etching apparatus, and an eventual overlay estimation correction value is thereby calculated. More specifically, the correction model creation process described above is executed for each combination of a film formation apparatus and an etching apparatus to calculate an eventual overlay estimation correction value. In this case, the overlay estimation correction value is acquired by using processing contents that include a film formation apparatus and an etching apparatus to be used, in addition to film formation conditions, heating process conditions, and etching conditions.

When a stacked structure of first and second layers is formed on a wafer by a first process, a photomask subjected to first mask layout correction is used in a light-exposure process. When the stacked structure of first and second layers is formed on a wafer by a second process prepared by partly changing the first process, if a photomask subjected to the first mask layout correction is used in the light-exposure process, the overlay residual could exceed an acceptable range.

Figure 9A:
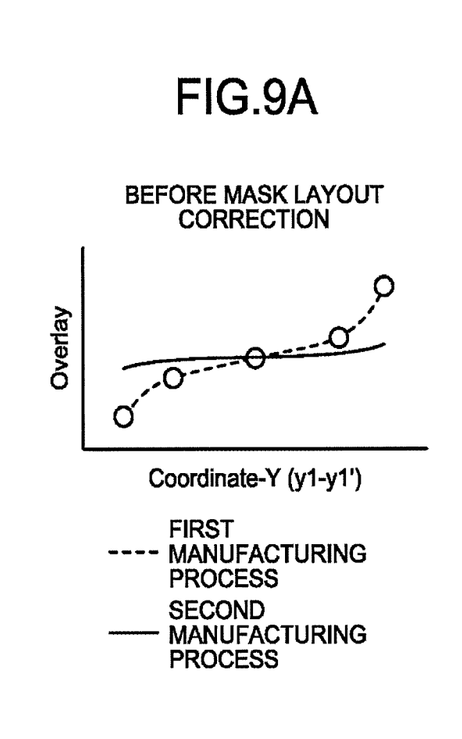
FIGS. 9A to 9C are diagrams schematically illustrating the state of overlay residuals in a case where a reference manufacturing process is partly changed, but mask layout correction is performed in the same way as in the reference manufacturing process.
Figure 9B:
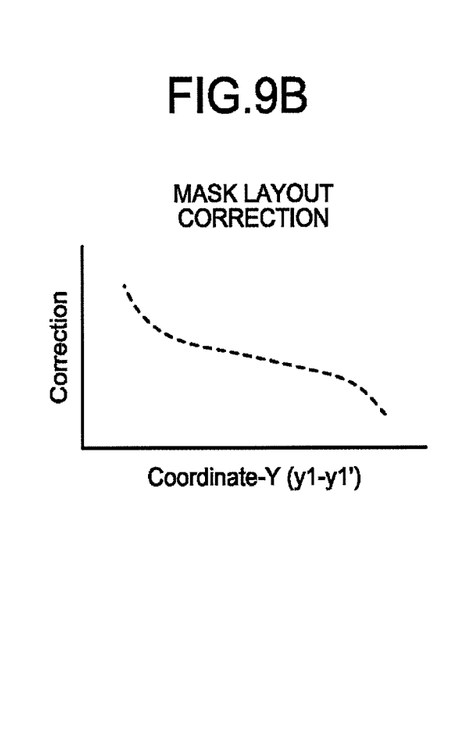
Figure 9C:
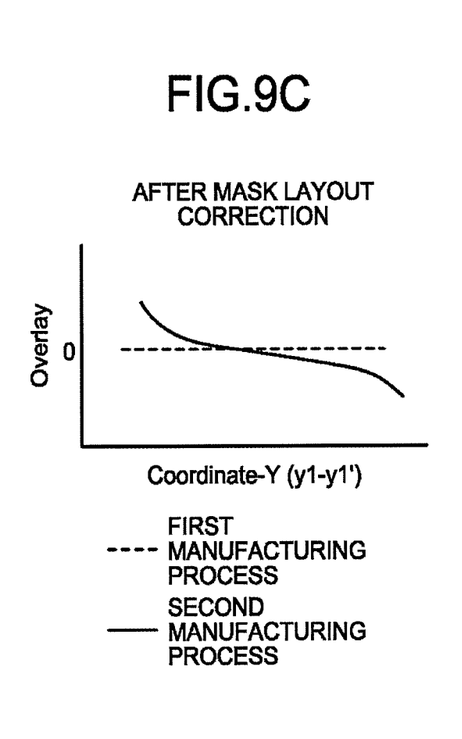

FIGS. 9A to 9C are diagrams schematically illustrating the state of overlay residuals in a case where a reference manufacturing process is partly changed, but mask layout correction is performed in the same way as in the reference manufacturing process. The examples set out here illustrate overlay residuals and mask layout correction amount information at positions along the line y1-y1' on a memory cell array part.

FIG. 9A is a diagram illustrating an example of overlay residuals that are obtained before mask layout correction is performed. The overlay residuals of a first manufacturing process are indicated by a symbol "o". In order to cancel the overlay residuals of the first manufacturing process, mask layout correction is performed as illustrated in FIG. 9B. As a result, the mask layout correction illustrated in FIG. 9B is added to the overlay residuals of the first manufacturing process illustrated in FIG. 9A, so that overlay residuals after the mask layout correction become almost zero, as illustrated in FIG. 9C.

It is assumed that a second manufacturing process prepared by partly changing the first manufacturing process renders overlay residuals indicated by the solid line in FIG. 9A. In this case, when the mask layout correction of FIG. 9B applied to the first manufacturing process is performed to the second manufacturing process, the overlay residuals may be unable to fall within an acceptable range, as indicated by the solid line in FIG. 9C. In this way, when the same mask layout correction is used for the second manufacturing process prepared by partly changing the first manufacturing process, the mask layout correction amount becomes unsuitable for the overlay deviation amount, and the overlay correction residuals end up being larger.

In contrast, according to the embodiment described above, an overlay estimation correction value is calculated by creating a correction model, on the basis of the mask outcome examination result, the mask layout difference correction amount, the step processing history, the measurement result of position deviation between the upper and lower layer patterns, and the overlay residual. Then, this overlay estimation correction value is used to perform correction in the light-exposure process. Consequently, an effect is obtained such that, even when the manufacturing process is changed, it is possible to hold the overlay deviation amount within an acceptable range, and to ensure the overlay accuracy, without deteriorating the image formation performance and throughput of the light-exposure apparatus.

Further, when the manufacturing process has variations, an overlay estimation correction value is calculated by creating a correction model, for each combination of manufacturing apparatuses, on the basis of the mask outcome examination result, the mask layout difference correction amount, the step processing history, the measurement result of position deviation between the upper and lower layer patterns, and the overlay residual. Then, this overlay estimation correction value is used to perform correction in the light-exposure process. Consequently, an effect is obtained such that, even when the manufacturing process has variations, it is possible to hold the overlay deviation amount within an acceptable range, and to ensure the overlay accuracy, without deteriorating the image formation performance and throughput of the light-exposure apparatus.

Figure 10:
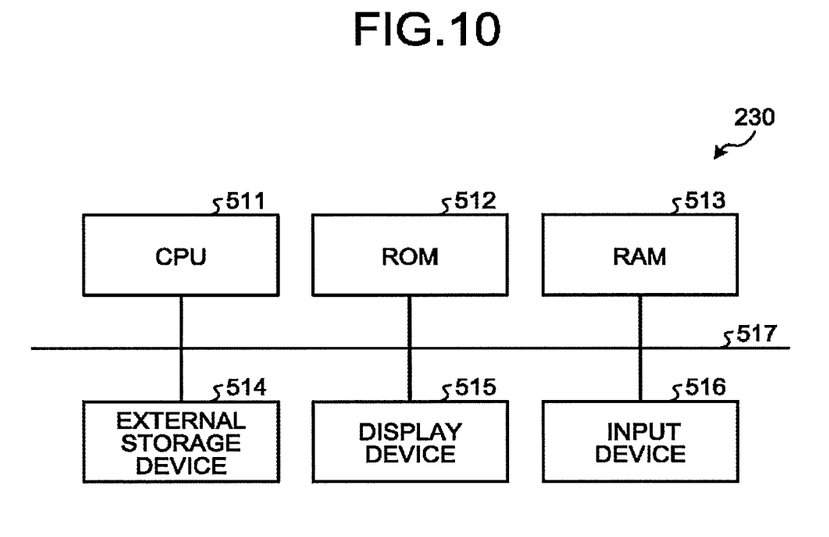
FIG. 10 is a diagram illustrating a hardware configuration example of the light-exposure control unit.

FIG. 10 is a diagram illustrating a hardware configuration example of the light-exposure control unit. The light-exposure control unit 230 has a hardware configuration utilizing an ordinary computer, in which a Central Processing Unit (CPU) 511, a Read Only Memory (ROM) 512, a Random Access Memory (RAM) 513 serving as the main storage device, an external storage device 514, such as a Hard Disk Drive (HDD), Solid State Drive (SSD), or Compact Disc (CD) drive device, a display device 515, such as a display, and an input device 516, such as a keyboard and/or a mouse, are included, and are connected to each other via a bus line 517.

A program to be executed by the light-exposure control unit 230 according to the embodiment has been prepared to perform the correction model creation process illustrated in FIG. 6. This program is provided in a state recorded in a computer-readable recording medium, such as a CD-ROM, flexible disk (FD), CD-R, or Digital Versatile Disk (DVD), by a file in an installable format or executable format. Specifically, the correction model creation part 231 is achieved by the CPU 511 (arithmetic processing part) configured to execute a program that contains the sequence of the correction model creation process.

Alternatively, a program to be executed by the light-exposure control unit 230 according to the embodiment may be provided such that the program is stored in a computer connected to a network, such as the internet, and is downloaded via the network. Further, a program to be executed by the light-exposure control unit 230 according to the embodiment may be provided such that the program is provided or distributed via a network, such as the internet.

Alternatively, a program according to the embodiment may be provided in a state incorporated in a ROM or the like in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-exposure method comprising:
performing a first test process concerning a light-exposure process by forming a first lower layer and a first upper layer on a first substrate, wherein the first test process includes performing film formation of the first lower layer on the first substrate, forming a first resist pattern by performing light-exposure to a resist present on the first lower layer by using a first photomask subjected to mask layout correction, processing the first lower layer by using the first resist pattern as a mask, performing film formation of the first upper layer on the first lower layer, forming a second resist pattern by performing light-exposure to a resist present on the first upper layer by using a second photomask subjected to mask layout correction, and processing the first upper layer by using the second resist pattern as a mask;

performing a second test process concerning a light-exposure process by forming a second lower layer and a second upper layer on a second substrate, wherein the second test process includes performing film formation of the second lower layer on the second substrate, forming a third resist pattern by performing light-exposure to a resist present on the second lower layer by using the first photomask, processing the second lower layer by using the third resist pattern as a mask, performing film formation of the second upper layer on the second lower layer, forming a fourth resist pattern by performing light-exposure to a resist present on the second upper layer by using the second photomask, and processing the second upper layer by using the fourth resist pattern as a mask;

calculating a first pattern position deviation amount attributed to a layout between upper and lower layer patterns in each of the first test process and the second test process;

acquiring a step processing history in each of the first test process and the second test process;

calculating a second pattern position deviation amount attributed to a substrate shape between the upper and lower layer patterns in each of the first test process and the second test process;

calculating an overlay residual between the upper and lower layer patterns after light-exposure in each of the first test process and the second test process;

creating a correction model calculating an overlay estimation correction value between the upper and lower layers, on a basis of the first pattern position deviation amount, the step processing history, the second pattern position deviation amount, and the overlay residual; and performing a manufacturing process by forming a third lower layer and a third upper layer on a third substrate, wherein the manufacturing process includes performing film formation of the third lower layer on the third substrate, forming a fifth resist pattern by performing light-exposure to a resist present on the third lower layer by using the first photomask, processing the third lower layer by using the fifth resist pattern as a mask, performing film formation of the third upper layer on the third lower layer, and forming a sixth resist pattern by performing light-exposure to a resist present on the third upper layer by using the second photomask, wherein in the performing the manufacturing process, an overlay estimation correction value is calculated by using the correction model, on a basis of the first pattern position deviation amount, a step processing history in the manufacturing process, the second pattern position deviation amount, and the overlay residual, and the overlay estimation correction value is used in a light-exposure process.

2. The light-exposure method according to claim 1, wherein the step processing history includes a film formation condition, a processing process condition, and a thermal history, about each of a lower layer and an upper layer.

3. The light-exposure method according to claim 1, wherein the step processing history includes information that specifies a film formation apparatus used for film formation and a processing apparatus used for processing, and in the creating the correction model, the correction model is created for each combination of a film formation apparatus and a processing apparatus that are to be used.

4. The light-exposure method according to claim 1, wherein, in the calculating the first pattern position deviation amount, the first pattern position deviation amount is calculated from a mask layout correction amount for the first photomask and a mask layout correction amount for the second photomask.

5. The light-exposure method according to claim 1, wherein, in the calculating the second pattern position deviation amount, the second pattern position deviation amount is calculated from a shape measurement result of the second substrate obtained when the second lower layer is formed in the second test process, and a shape measurement result of the second substrate obtained when the second upper layer is formed in the second test process.

6. The light-exposure method according to claim 1, wherein, in the calculating the overlay residual, the overlay residual is calculated on a basis of light-exposure process history information about formation of the third resist pattern and formation of the fourth resist pattern, and an overlay measurement result obtained in the second test process.

7. The light-exposure method according to claim 1, further comprising acquiring a mask outcome examination result for each of the first photomask and the second photomask, wherein in the creating the correction model, the correction mode for calculating an overlay estimation correction value between the upper and lower layers is created on a basis of the first pattern position deviation amount, the step processing history, the second pattern position deviation amount, the overlay residual, and the mask outcome examination result.

8. A semiconductor device manufacturing method comprising:

performing a first test process concerning a light-exposure process by forming a first lower layer and a first upper layer on a first substrate, wherein the first test process includes performing film formation of the first lower layer on the first substrate, forming a first resist pattern by performing light-exposure to a resist present on the first lower layer by using a first photomask subjected to mask layout correction, processing the first lower layer by using the first resist pattern as a mask, performing film formation of the first upper layer on the first lower layer, forming a second resist pattern by performing light-exposure to a resist present on the first upper layer by using a second photomask subjected to mask layout correction, and processing the first upper layer by using the second resist pattern as a mask;

performing a second test process concerning a light-exposure process by forming a second lower layer and a second upper layer on a second substrate, wherein the second test process includes performing film formation of the second lower layer on the second substrate, forming a third resist pattern by performing light-exposure to a resist present on the second lower layer by using the first photomask, processing the second lower layer by using the third resist pattern as a mask, performing film formation of the second upper layer on the second lower layer, forming a fourth resist pattern by performing light-exposure to a resist present on the second upper layer by using the second photomask, and processing the second upper layer by using the fourth resist pattern as a mask;

calculating a first pattern position deviation amount attributed to a layout between upper and lower layer patterns in each of the first test process and the second test process;

acquiring a step processing history in each of the first test process and the second test process;

calculating a second pattern position deviation amount attributed to a substrate shape between the upper and lower layer patterns in each of the first test process and the second test process;

calculating an overlay residual between the upper and lower layer patterns after light-exposure in each of the first test process and the second test process;

creating a correction model for calculating an overlay estimation correction value between the upper and lower layers, on a basis of the first pattern position deviation amount, the step processing history, the second pattern position deviation amount, and the overlay residual; and performing a manufacturing process by forming a third lower layer and a third upper layer on a third substrate of a semiconductor wafer to be processed, wherein the manufacturing process includes performing film formation of the third lower layer on the third substrate, forming a fifth resist pattern by performing light-exposure to a resist present on the third lower layer by using the first photomask, processing the third lower layer by using the fifth resist pattern as a mask, performing film formation of the third upper layer on the third lower layer, and forming a sixth resist pattern by performing light-exposure to a resist present on the third upper layer by using the second photomask, wherein in performing the manufacturing process, an overlay estimation correction value is calculated by using the correction model, on a basis of the first pattern position deviation amount, a step processing history in the manufacturing process, the second pattern position deviation amount, and the overlay residual, and the overlay estimation correction value is used in a light-exposure process.

9. The semiconductor device manufacturing method according to claim 8, wherein the step processing history includes a film formation condition, a processing process condition, and a thermal history, about each of a lower layer and an upper layer.

10. The semiconductor device manufacturing method according to claim 8, wherein the step processing history includes information that specifies a film formation apparatus used for film formation and a processing apparatus used for processing, and in the creating the correction model, the correction model is created for each combination of a film formation apparatus and a processing apparatus that are to be used.

11. The semiconductor device manufacturing method according to claim 8, wherein, in the calculating the first pattern position deviation amount, the first pattern position deviation amount is calculated from a mask layout correction amount for the first photomask and a mask layout correction amount for the second photomask.

12. The semiconductor device manufacturing method according to claim 8, wherein, in the calculating the second pattern position deviation amount, the second pattern position deviation amount is calculated from a shape measurement result of the second substrate obtained when the second lower layer is formed in the second test process, and a shape measurement result of the second substrate obtained when the second upper layer is formed in the second test process.

13. The semiconductor device manufacturing method according to claim 8, wherein, in the calculating the overlay residual, the overlay residual is calculated on a basis of light-exposure process history information about formation of the third resist pattern and formation of the fourth resist pattern, and an overlay measurement result obtained in the second test process.

* * * * *